(12) United States Patent
Takahashi et al.

(10) Patent No.: US 8,400,608 B2
(45) Date of Patent: Mar. 19, 2013

(54) DISPLAY APPARATUS

(75) Inventors: Shohei Takahashi, Daito (JP); Masaya Nakamichi, Kizugawa (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 333 days.

(21) Appl. No.: 12/837,738

(22) Filed: Jul. 16, 2010

(65) Prior Publication Data

US 2011/0011561 A1 Jan. 20, 2011

(30) Foreign Application Priority Data

Jul. 16, 2009 (JP) ................................ 2009-167340

(51) Int. Cl.
  *G02F 1/1333* (2006.01)
(52) U.S. Cl. ........................................ 349/161; 361/688
(58) Field of Classification Search ........................ None
  See application file for complete search history.

(56) References Cited

U.S. PATENT DOCUMENTS

| 5,991,153 A * | 11/1999 | Heady et al. .................. 361/704 |
| 7,532,467 B2 * | 5/2009 | Launay et al. ........... 361/679.48 |
| 2006/0082271 A1 | 4/2006 | Lee et al. |
| 2008/0222932 A1 | 9/2008 | Yun et al. |

FOREIGN PATENT DOCUMENTS

| JP | 2005286987 | 10/2005 |
| JP | 2007293105 | 8/2007 |

* cited by examiner

*Primary Examiner* — Thanh-Nhan P Nguyen
(74) *Attorney, Agent, or Firm* — NDQ&M Watchstone LLP

(57) ABSTRACT

A display apparatus according to the present invention comprises a display part, a housing which accommodates the display part, a circulator circulating the air in the housing around the display part in a vertical direction, and a fan provided on a rear side of the display part. The housing makes the display part be seen from outside therethrough. The fan converts the flow of the air circulating in the vertical direction to a horizontal direction in order to disperse heat generated from a rear surface of the display part.

4 Claims, 4 Drawing Sheets

DISPLAY APPARATUS

The Japanese patent application Number 2009-167340, upon which this patent application is based, is hereby incorporated by reference.

BACKGROUND OF THE INVENTION

1. Field of the Invention

The present invention relates to a display apparatus with a flat image display panel.

2. Description of Related Art

In recent years, flat panel display apparatuses for outdoor installation have appeared. In the apparatus, in order to protect the panel from weather, dust and the like, there has been considered to provide the panel within an accommodation chamber having a sealed structure.

However, in such apparatus, since heat is difficult to release outside from the inside of the accommodation chamber having a sealed structure, temperature of the air in the chamber easily increases due to sunlight or due to heat generated from the panel during operation. Thus, temperature of the panel could be increased, which disables the image displaying on the panel.

SUMMARY OF THE INVENTION

A first display apparatus according to the present invention comprises a display part, a housing which accommodates the display part, a circulator circulating the air in the housing around the display part in a vertical direction, and a fan provided on a rear side of the display part. The housing makes the display part be seen from outside therethrough. The fan converts the flow of the air circulating in the vertical direction to a horizontal direction in order to disperse heat generated from a rear surface of the display part.

A second display apparatus according to the present invention comprises an accommodation chamber accommodating an image display panel. Here a circulation flow channel surrounding the image display panel is formed in the accommodation chamber. The circulation flow channel includes a rear side vertical flow channel portion extending in a vertical direction on a rear side of the image display panel and having a width smaller than that of the image display panel, a lateral side flow channel portion extending in the vertical direction on a lateral side of the image display panel, and a rear side horizontal flow channel portion extending in a horizontal direction on the rear side of the image display panel along a rear surface of the image display panel. The rear side horizontal flow channel portion allows communication between the rear side vertical flow channel portion and the lateral side flow channel portion. The accommodation chamber is further provided therein with a circulator circulating the air in the circulation flow channel, and a cooler cooling the circulating air. The circulator allows the air in the rear side vertical flow channel portion to flow into the lateral side flow channel portion through the rear side horizontal flow channel portion.

DETAILED DESCRIPTION OF THE PREFERRED EMBODIMENT

A display apparatus according to a preferred embodiment of the present invention is discussed in detail below with reference to drawings.

Figure 1:
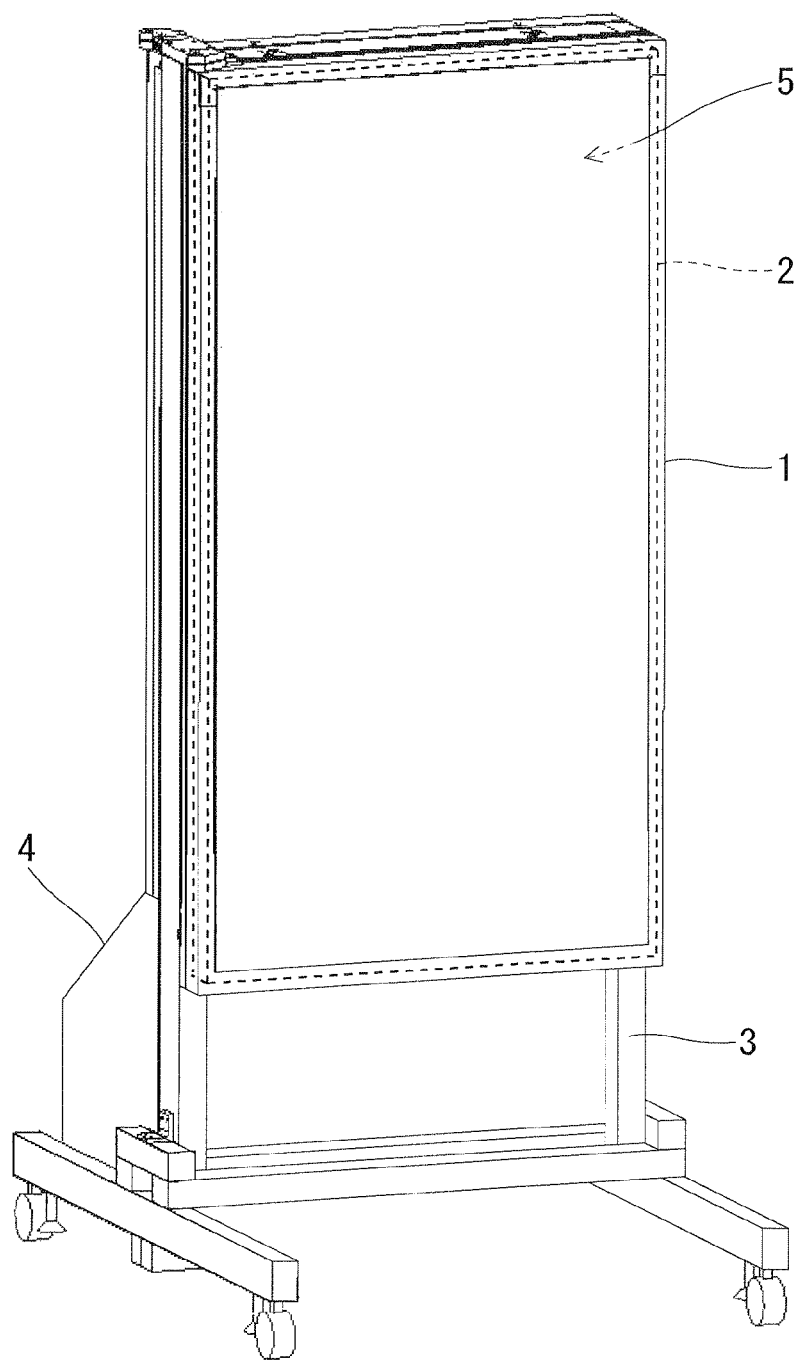
FIG. 1 is a perspective view of a display apparatus according to one embodiment of the present invention seen from a front side.

FIG. 1 is a perspective view of the display apparatus seen from a front side. As shown in FIG. 1, the display apparatus comprises a housing 1, a liquid crystal display panel 2 arranged in the housing 1, a support base 3 with casters for supporting the housing 1, and a cooling device 4. The panel 2 includes a display surface viewable from outside the housing 1.

Inside the housing 1, formed is an accommodation chamber where the panel 2 is accommodated. The chamber 5 has a structure in which an air inside is sealed. Therefore, the panel 2 in the chamber 5 does not contact outside air, and thus an outdoor installation of the display apparatus is enabled. That is, the panel 2 in the chamber 5 is protected from weather and dust, when the apparatus is installed outdoors. Also, the cooling device 4 comprises an evaporator, a condenser, and a compressor (not shown). The air in the chamber 5 is cooled by the cooling device 4.

Figure 2:
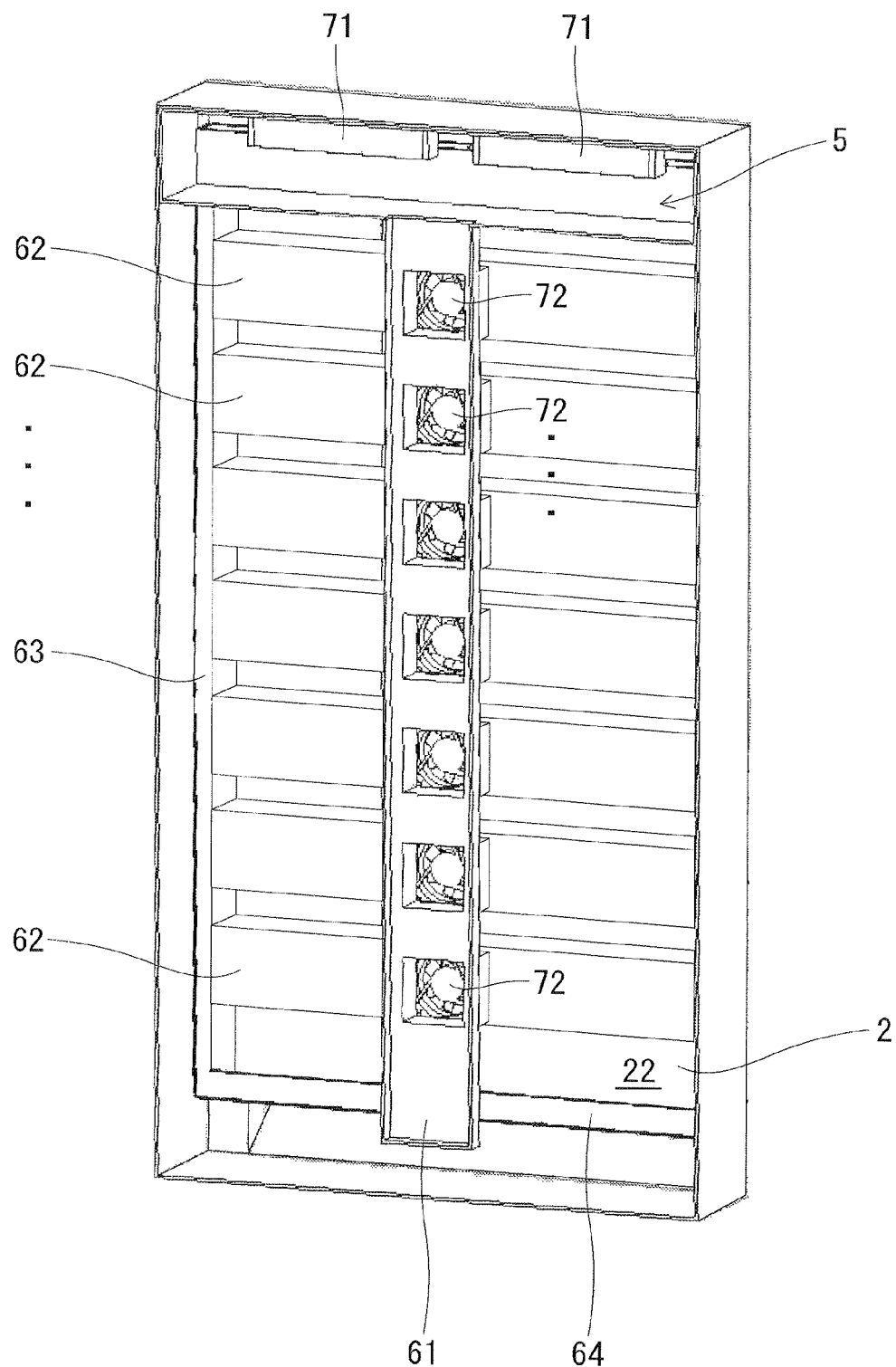
FIG. 2 is a perspective view of an accommodation chamber included in the display apparatus seen from a rear side.
Figure 3:
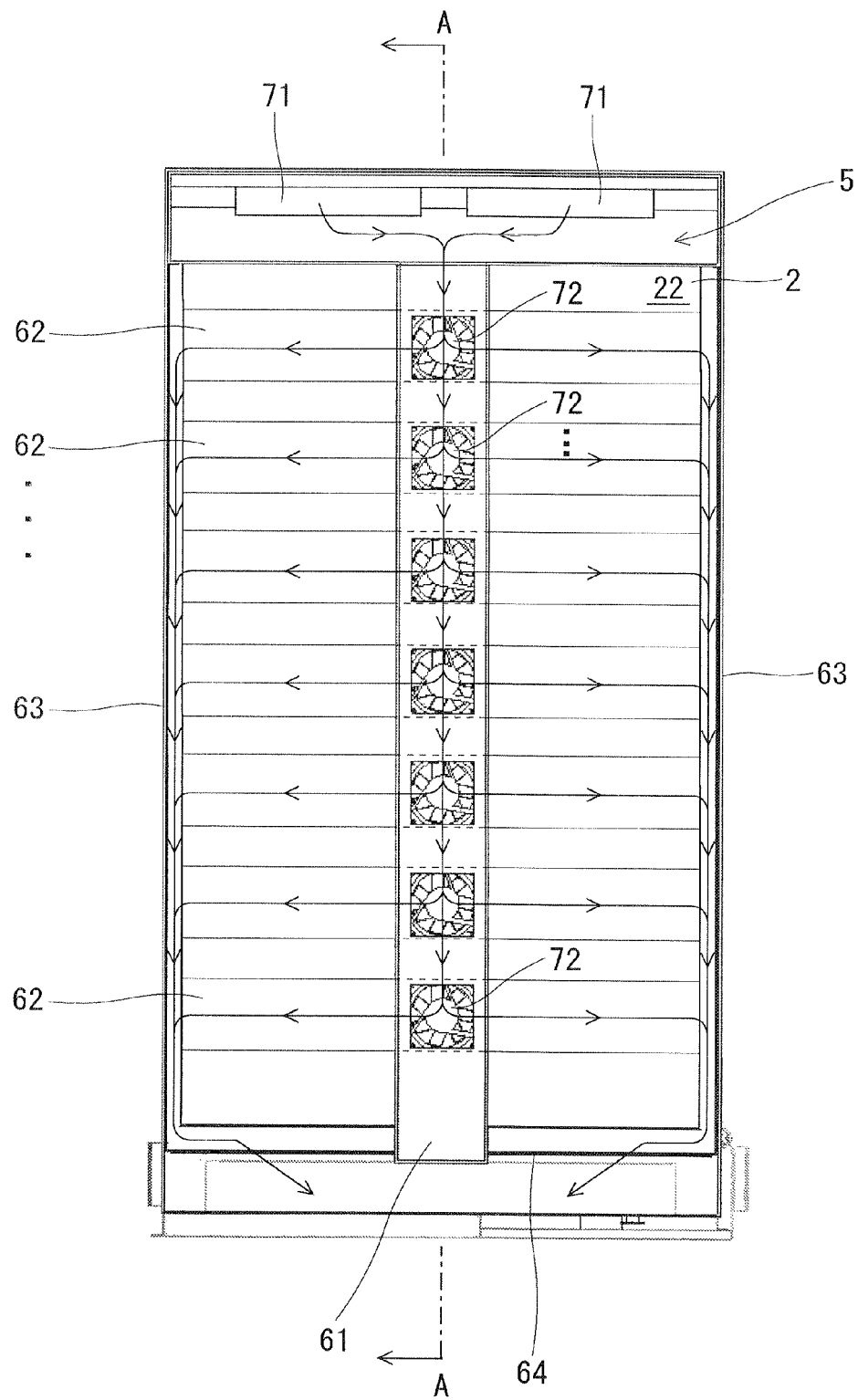
FIG. 3 is a back view of the accommodation chamber.
Figure 4:
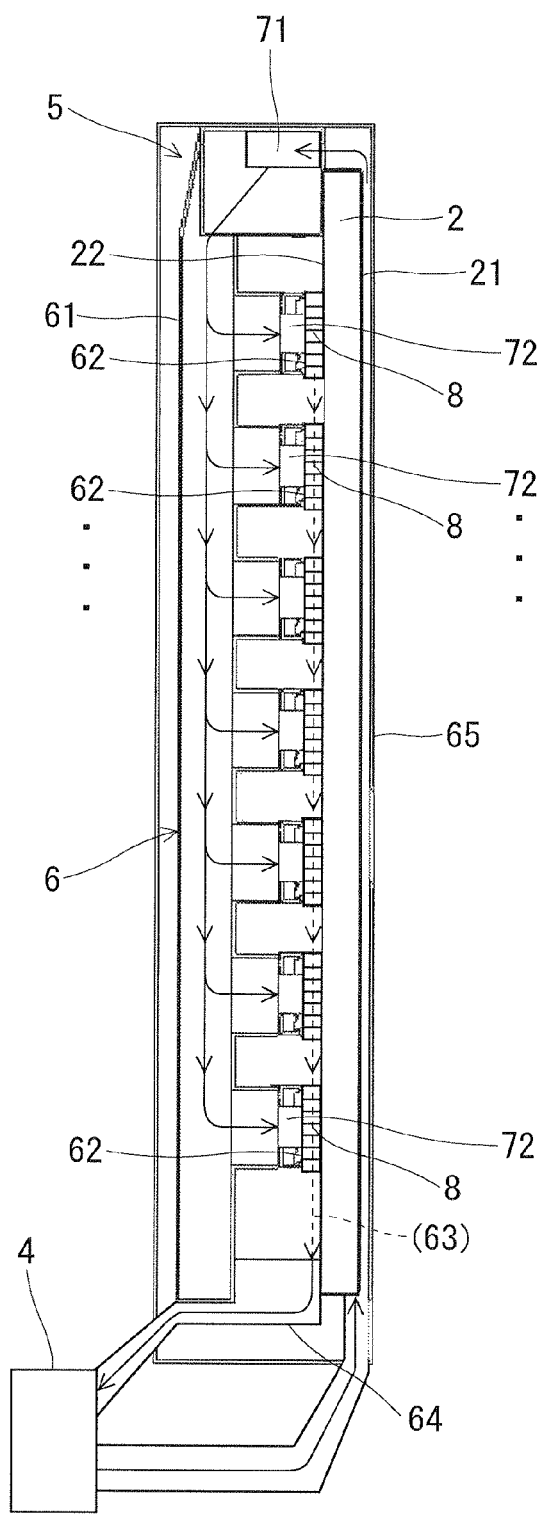
FIG. 4 is a cross sectional view taken along an A-A line shown in FIG. 3.

FIG. 2 and FIG. 3 are a perspective view and a plane view of the chamber 5 seen from a rear side, respectively. Also, FIG. 4 is a cross sectional view taken along an A-A line shown in FIG. 3. FIGS. 2 and 3 show the state of the chamber 5 when a rear wall thereof is taken off.

As shown in FIG. 4, inside the chamber 5, formed is a circulation flow channel 6 surrounding the panel 2. As shown in FIGS. 2 and 3, the channel 6 includes a rear side vertical flow channel portion 61, a plurality of rear side horizontal flow channel portions 62, a pair of lateral side flow channel portions 63, 63, and a lower side flow channel portion 64.

The portion 61 extends in a vertical direction on a rear side of the panel 2 at a position where it faces a central part of the panel 2, and its width is smaller than that of the panel 2.

The pair of portions 63, 63 extends in a vertical direction on both lateral sides of the panel 2, and is connected each other at a lower end part through the portion 64. Here, the portion 64 extends in a horizontal direction on a lower side of the panel 2.

The portions 62 are arranged in the vertical direction. Each of the portions 62 contacts with a rear surface 22 of the panel 2, and extends toward the portion 63 and is arranged in a space between the surface 22 and the portion 61. Each of the portions 62 has a central part which communicates with the portion 61, and both end parts which communicates with the portion 63.

Thus, the portion 61 and the pair of portions 63, 63 are communicated with each other through the portion 62.

FIG. 4 is a cross sectional view taken along an A-A line shown in FIG. 3. As shown in FIG. 4, a radiator plate 8 is formed inside the portion 62.

As shown in FIG. 4, the channel 6 further has a front side flow channel portion 65 extending in a vertical direction along a front surface 21 of the panel 2. The portion 65 communicates with the portion 61 in its upper end part, and communicates with the portion 64 in its lower end part via the cooling device 4.

As shown in FIGS. 2 to 4, a pair of first fans 71, 71 and a plurality of second fans 72 for circulating the air in the channel 6 are further arranged in the chamber 5.

The fans 71, 71 are arranged near the upper end of the portion 65 and lead the air in the portion 65 to the portion 61. On the other hand, the fans 72 are the fans for cooling a light source (such as LED) of the panel 2. By arranging each of the fans 72 at the central part of the portion 62, the fans 72 can be utilized as fans for leading the air in the portion 61 to the portion 62.

Therefore, by driving the fans 71 and 72, the air in the channel 6 circulate in the portions 61, 62, 63, 64, the device 4, and the portion 65 as indicated by arrows shown in FIGS. 3 and 4.

By flowing the air inside the portion 61, the air in the chamber 5 can flow downward on the rear side of the panel 2 efficiently.

Further, according to the fans 72, since the air in the portion 61 can easily flow into the portions 62, pressure loss in the channel 6 can be reduced.

In the display apparatus described above, by circulating the air in the channel 6 by the fans 71 and the fans 72, the air cooled by the cooling device 4 is led to the rear side of the panel 2 and flows along the rear surface 22. Therefore, heat generated from the panel 2 is eliminated from the rear surface 22. Although the air flowing along the rear surface 22 may be warmed by heat of the panel 2, the warmed air is led to the portions 63, 63, and the heat is diffused in a horizontal direction.

Thus, although the air flowing along the rear surface 22 may be warmed by the panel 2, the air in the rear surface 22 is kept cooler. Therefore, the panel 2 is cooled efficiently, and the temperature increase of the panel 2 is inhibited. Thus the functions of the panel 2 are maintained in good condition.

Also, in the apparatus described above, since the heat generated from the panel 2 is eliminated. from the front surface 21 also, the panel 2 is cooled more efficiently.

Further, in the apparatus described above, pressure loss in the channel 6 is reduced, and thus, has a high cooling efficiency. Also, in the apparatus described above, since the radiator plate 8 is formed in the portion 62, the heat generated from the panel 2 is transmitted to the portion 62, and thus, the display apparatus has a high cooling efficiency.

The present invention is not limited to the foregoing embodiment in construction but can be modified variously by one skilled in the art without departing from the spirit of the invention as set forth in the appended claims. In the embodiment described above, the portion 65 communicates with the portion 61 in its upper end part and communicates with the cooling device 4 in its lower end. However, the present invention is not limited to this. For example, upper end parts of the pair of portions 63, 63 may be connected each other through an upper side flow channel portion provided on an upper side of the panel 2, and the portion 61 may be communicated with the lower end part of the portion 65, while the upper side flow channel portion may be communicated with the upper end part of the portion 65 via the cooling device 4.

Also, the constructions employed in the display apparatus described above can be applied not only to the display apparatus with the panel 2, but also to various flat display apparatuses such as a plasma display, an organic EL (Electro-Luminescence) display.

In the embodiment described above, the circulating means for circulating the air in the channel 6 may be formed only by the fans 71, or said circulating means may be formed by both. the fans 71 and the fans 72.

When the circulating means is formed only by the fans 71, the display apparatus may have a construction in which the heat led to the horizontal direction by the fan 72 is not collected by the cooling device 4. For example, when the display apparatus is for indoor installation, since a sealed structure is not necessarily employed for the chamber 5, the panel 2 can be cooled only by emitting the air led by the fans 72 from an air outlet provided on a lateral surface of the housing 1. The air led by the fans 72 may be released outside through a duct, which is leading to the outside air, arranged on the lateral side of the chamber 5, and extending in the vertical direction.

On the other hand, when the display apparatus is for outdoor installation, since the sealed structure should be employed for the chamber 5, it is preferable to collect the air led in the horizontal direction by the fans 72 by the cooling device 4.

When the circulating means is formed by both the fans 71 and the fans 72, the display apparatus may have the structure where the fans 72 flow the air in the vertical direction and the horizontal direction, and the heat led to the horizontal direction is not collected by the cooling device 4.

What is claimed is:

1. A display apparatus comprising an accommodation chamber accommodating an image display panel, wherein a circulation flow channel surrounding the image display panel is formed in the accommodation chamber, the circulation flow channel includes a rear side vertical flow channel portion extending in a vertical direction on a rear side of the image display panel and having a width smaller than that of the image display panel, a lateral side flow channel portion extending in the vertical direction on a lateral side of the image display panel, and a rear side horizontal flow channel portion extending in a horizontal direction on the rear side of the image display panel along a rear surface of the image display panel and allowing communication between the rear side vertical flow channel portion and the lateral side flow channel portion, the accommodation chamber is further provided therein with a circulator circulating the air in the circulation flow channel, and a cooler cooling the circulating air, and the circulator allows the air in the rear side vertical flow channel portion to flow into the lateral side flow channel portion through the rear side horizontal flow channel portion.

2. The display apparatus according to claim 1, wherein the circulation flow channel further includes a front side flow channel portion extending in a vertical direction on a front side of the image display panel along a front surface of the image display panel, and the rear side vertical flow channel portion is in communication with either part of an upper end part and a lower end part of the front side flow channel portion while the lateral side flow channel portion is in communication with the other part.

3. The display apparatus according to claim 1, wherein the rear side vertical flow channel portion extends in the vertical direction on the rear side of the image display panel at a position facing a central part of the image display panel, the lateral side flow channel portion is arranged on both lateral sides of the image display panel, and the rear side horizontal flow channel portion extends from the rear side vertical flow channel portion in both horizontal directions toward both lateral surfaces of the image display panel to be in communication with each lateral side flow channel portion.

4. The display apparatus according to claim 1, wherein in the rear side horizontal flow channel portion, a radiator plate extending in the longer direction of the rear side horizontal flow channel portion is formed.

* * * * *